US008556438B2

(12) United States Patent
McKenzie et al.

(10) Patent No.: US 8,556,438 B2
(45) Date of Patent: Oct. 15, 2013

(54) TUNABLE COLOUR LED MODULE

(75) Inventors: James Stuart McKenzie, Falmouth (GB); Majd Zoorob, Southampton (GB); Thomas David Matthew Lee, Basingstoke (GB)

(73) Assignee: Synoptics Limited, Cambridge (GB)

( * ) Notice: Subject to any disclaimer, the term of this patent is extended or adjusted under 35 U.S.C. 154(b) by 291 days.

(21) Appl. No.: 13/056,806

(22) PCT Filed: Jul. 30, 2009

(86) PCT No.: PCT/GB2009/001865
§ 371 (c)(1),
(2), (4) Date: Jan. 31, 2011

(87) PCT Pub. No.: WO2010/012999
PCT Pub. Date: Feb. 4, 2010

(65) Prior Publication Data
US 2011/0133654 A1    Jun. 9, 2011

(30) Foreign Application Priority Data
Jul. 30, 2008    (GB) .................................. 0813919.8

(51) Int. Cl.
*F21V 9/16*    (2006.01)
(52) U.S. Cl.
USPC ................. 362/84; 362/231; 257/89; 257/98; 257/103
(58) Field of Classification Search
USPC ............ 257/79, 88, 89, 98, 103; 362/84, 231, 362/249.02, 800
See application file for complete search history.

(56) References Cited

U.S. PATENT DOCUMENTS 6,788,011 B2    9/2004    Mueller et al.
7,036,219 B2 *  5/2006    He ................................... 29/842
(Continued)

FOREIGN PATENT DOCUMENTS

EP    1 589 591    10/2005
EP    1 865 564    12/2007
(Continued)

OTHER PUBLICATIONS

International Search Report and Written Opinion of corresponding International Application No. PCT/GB2009/001865, dated Apr. 6, 2010.
(Continued)

*Primary Examiner* — Thuy Vinh Tran
(74) *Attorney, Agent, or Firm* — Renner, Otto, Boisselle & Sklar, LLP

(57) ABSTRACT

A tunable color LED module comprises at least two sub-modules, each comprising an LED (104), a wavelength converting element (WCE) (201, 112, 203) and a reflector cup. The total light emitted by the module comprises light generated from each LED and WCE and the module is configured to emit a total light having a predefined color chromaticity when activation properties of the LEDs are managed appropriately. The total light may have a broad white emission spectrum (106). The module combines the benefits of a low cost with uniform chromaticity properties in the far field, and offers long and controlled lifetime at the same time as flexibility and intelligence of tunable color chromaticity, Color Rendering Index (CRI) and intensity, either at manufacture or in an end user lighting application. A controlled LED module system comprises a control system for the managing activation properties of the LEDs in the sub-modules. Also described is a method of manufacture.

17 Claims, 16 Drawing Sheets

(56) References Cited

U.S. PATENT DOCUMENTS

| | | |
|---|---|---|
| 7,213,940 B1 | 5/2007 | Van De Ven et al. |
| 7,350,933 B2 * | 4/2008 | Ng et al. .......................... 362/84 |
| 7,547,124 B2 * | 6/2009 | Chang et al. ................. 362/373 |
| 7,622,317 B2 * | 11/2009 | Higashi et al. .................. 438/35 |
| 2005/0122065 A1 | 6/2005 | Young |
| 2006/0226956 A1 | 10/2006 | Young et al. |
| 2006/0258028 A1 | 11/2006 | Paolini et al. |
| 2006/0261742 A1 | 11/2006 | Ng et al. |
| 2007/0064407 A1 | 3/2007 | Huang et al. |
| 2007/0064421 A1 | 3/2007 | Baba |
| 2007/0120496 A1 | 5/2007 | Shimizu et al. |
| 2008/0048193 A1 | 2/2008 | Yoo et al. |
| 2008/0067534 A1 | 3/2008 | Hsieh et al. |
| 2008/0151527 A1 | 6/2008 | Ueno et al. |

FOREIGN PATENT DOCUMENTS

| | | |
|---|---|---|
| JP | 2007-122950 | 5/2007 |
| JP | 2008-235680 | 10/2008 |

OTHER PUBLICATIONS

UK Search Report for corresponding GB Application No. 0813919.8, dated Nov. 11, 2008.

* cited by examiner

TUNABLE COLOUR LED MODULE

This application is a national phase of International Application No. PCT/GB2009/001865 filed Jul. 30, 2009, and published in the English language as WO 2010/012999 on Feb. 4, 2010.

FIELD OF THE INVENTION

The present invention relates to a colour tunable light emitting diode (LED) module comprising multiple LED die and wavelength converting elements, and in particular a method and device that eliminates manufacturer colour temperature binning by means of a designed colour mix trimming system.

BACKGROUND TO THE INVENTION

Light emitting devices and diodes are based on a forward biased p-n junction. LEDs have recently reached high brightness levels that have allowed them to enter into new solid state lighting applications as well as replacements for high brightness light sources such as light engines for projectors and automotive car headlights. These markets have also been enabled by the economical gains achieved through the high efficiencies of LEDs, as well as reliability, long lifetime and environmental benefits. These gains have been partly achieved by use of LEDs that are capable of being driven at high currents and hence produce high luminous outputs while still maintaining high wall plug efficiencies.

Solid state lighting applications require that LEDs exceed efficiencies currently achievable by incandescent and fluorescent lighting technologies. Currently one of the preferred routes for the generation of White light from an LED module is by use of a single colour LED (such as a blue LED) and a wavelength converting element (such as a yellow phosphor). Wavelength converting elements (WCE) typically comprise of a yellow phosphor mixed in an encapsulant at the correct composition to generate a white colour of the desired colour temperature. By modifying the fill fraction composition or % weight the white light colour may be tuned. The ability to provide white light across a large chromaticity space is advantageous for different lighting applications. However, due to manufacturing inaccuracies associated with variation in LED emission wavelength, LED emission bandwidth, variation in WCE % weight and WCE composition different LED modules will exhibit white light emission characteristics with different chromaticity values. This is undesirable as sorting and binning of LED modules post manufacture is required.

In U.S. Pat. No. 6,788,011 the mixing of Red, 102, Green, 103, and Blue, 104, primary colour semiconductor LEDs are employed to provide white colour light as shown in FIG. 1a. In order to achieve the desired light intensity as well as the colour chromaticity on a CIE diagram, a control system is programmed with predefined LED driver power values for each individual LED colour. The light emission spectra intensity, 106, plotted against wavelength (as shown along 105) for each LED namely the Red LED, 109, Green, 108 and Blue, 107 are shown on the insert in FIG. 1a. The individual LEDs are assembled in a housing or board, 101. This LED lighting system suffers from several drawbacks.

Firstly, the LED lighting system proposed in U.S. Pat. No. 6,788,011 suffers from poor Colour Rendering Index (CRI) typically around 27-30 because of the individual narrow Red, Green and Blue wavelengths (approximately 10-25 nm bandwidth wavelength emission) having poor representation of the complete visible spectrum of light which is typically experienced from incandescent bulb illumination or blackbody radiation, 120, as shown in the insert in FIG. 1a. As a reference the CRI for a blackbody radiation is 100 and the value ranging between 0 and 100 defines how accurately light will portray colours relative to a blackbody source at the same nominal colour temperature.

Secondly, due to the different LED semiconductor material systems required to generate Red (typically InGaAlP) and Blue or Green (InGaAlN) wavelengths the voltages, lifetime and junction temperature may dramatically vary from one LED to another adversely affecting the stability of the LED lighting system and the overall colour chromaticity with lifetime as well as light intensity. This is typically very difficult to monitor without the addition of feedback control systems.

In U.S. Pat. No. 7,213,940B1 another colour control system is proposed, whereby a first semiconductor LED with a first lumiphor is provided to generate white light. In order to improve the CRI, a second semiconductor LED having a different emission wavelength is introduced into the optical mixing. This system provides much improved Colour Rendering Index (CRI) of around 80-92 due to the broader emission achieved by the first LED and lumiphor. The introduction of the second semiconductor LED with Red emission wavelengths has a limited emission bandwidth and hence is restricted in the amount that the CRI can be increased. Secondly, the external efficiency of state of the art commercial red emitting semiconductor materials such as InGaAlP is typically 30% which is much lower than that of GaN based blue emitting semiconductor LED systems (state of the art commercial LED external efficiency at 45%). Additionally, similar lifetime degradation problems compared to LED lighting devices in U.S. Pat. No. 6,788,011 are also experienced with the second semiconductor degrading at a different rate to the first LED.

In published U.S. Patent Application No. 2008/0048193 A1 a white LED module including a further circuit board is described. The LED module cross sectional schematic is shown in FIG. 1c. In one example of the invention a Green semiconductor LED, 103 and a Blue semiconductor LED, 104 are placed on circuit board 101. A Red phosphor, 112, is disposed over 103 and 104 to provide a total emitted white light intensity, 106, against wavelength 105. The total emitted white light has a broad red phosphor emission, 109, and narrow blue, 107, as well as a narrow green emission, 108, from the semiconductor LED die. The white light generated from the LED module suffers from a poor CRI (expected to be approximately 50-60) due to the narrow light emissions in the Blue and Green wavelength regions. Additionally, the intensity of the Green light, 113, is dramatically attenuated, 108. The total green light initially emitted from the LED die 103 is shown as a dotted line, while following the propagation through the Red phosphor 112 the final transmitted green light is shown as the solid line 108. The attenuated green light dramatically affects the total efficiency of the LED module. It is important to note that this applies across all wavelengths and not specifically for Red phosphors only.

As will be appreciated by those skilled in the art, there is currently a need for a LED module that combines the known benefits of low cost LED modules with the functionality of tunable colour chromaticity. It would be desirable to provide a module having uniform chromaticity properties, and which also displays good CRI and intensity with a long lifetime.

SUMMARY OF INVENTION

According to a first aspect of the present invention, a LED module comprises a first and a second LED sub-module disposed on a high thermal conductivity sub-mount, wherein:

the first LED sub-module comprises:
- a first semiconductor LED for generating light when activated, the first LED being in thermal contact with the sub-mount;
- a first high thermal conductivity reflector cup, the first LED being disposed in the first reflector cup; and,
- a first wavelength converting element (WCE) at least partially disposed over a surface of the first LED such that light emitted from the first LED is incident on the first WCE and is re-emitted at a substantially different wavelength; and, the second LED sub-module comprises:
- a second semiconductor LED for generating light when activated, the second LED being in thermal contact with the sub-mount;
- a second high thermal conductivity reflector cup, the second LED being disposed in the second reflector cup; and,
- a second wavelength converting element (WCE) at least partially disposed over a surface of the second LED such that light emitted from the second LED is incident on the second WCE and is re-emitted at a substantially different wavelength, the second WCE having different wavelength converting properties to the first WCE;

wherein:
the first and the second semiconductor LED comprise the same semiconductor material system;
the first WCE is at least partially in contact with the first reflector cup and the second WCE is at least partially in contact with the second reflector cup; and,
the total light emitted by the module comprises light generated from the first LED and WCE and light generated from the second LED and WCE, the module being configured to emit total light having a predefined colour chromaticity when one or more activation properties of the first and second LED are managed.

It is an object of the present invention that tight control of the correlated colour temperature (CCT) and Colour Rendering Index (CRI) of the total emitted light during manufacture is not required. It is a further object of the present invention that the CCT and CRI of the total emitted light is defined using a control system post manufacture rather than by inspection and sorting of the LED module into different CCT bins during module manufacture.

Typically, the LEDs are at least partially in direct physical contact with the high thermal conductivity sub-mount for the efficient dissipation of heat. The reflector cups sit around the respective LED and are designed to thermally dissipate heat generated by the respective WCE.

It is preferred that the first and/or second WCE is selected from a group of WCE elements which comprises phosphors, quantum dots (QDs), organic light emitting material, and electrically, ionically- or optically-pumped light emitting materials.

Preferably, the sub-mount comprises an electrical board having electrical tracking and an electrical isolation layer disposed between the tracking and the substrate of the sub-mount. The substrate may comprise of materials selected from a group of high thermal conductivity materials such as Cu, Al, W, Ag, CVD diamond, Diamond-Like Carbon (DLC) or ceramics such as AlN.

In preferred embodiments of the present invention, the sub-mount and/or reflector cup comprise a material having a thermal conductivity greater than 50 W/mK.

Preferably, the second WCE is adapted to re-emit light with a red shifted wavelength emission spectrum as compared to the first WCE and with an emission bandwidth greater than 40 nm.

In preferred embodiments of the present invention, the first and the second reflector cup enables the total emitted light to be more collimated than a Lambertian source and to allow the light emitted from the first and second reflector cup to mix in the far field.

Preferably, the LED module further comprises a third LED sub-module disposed on the high thermal conductivity sub-mount, the third LED sub-module comprising:
- a third semiconductor LED for generating light when activated, the third LED being in thermal contact with the sub-mount and comprising the same semiconductor material system as the first and the second semiconductor LED,
- a third high thermal conductivity reflector cup, the third LED being disposed in the third reflector cup; and,
- a third wavelength converting element (WCE) at least partially disposed on a surface of the third LED;

wherein, upon activation,
each of the first, the second and the third semiconductor LED emit light in the blue wavelength range;
the first WCE is configured to re-emit substantially in the yellow wavelength range;
the second WCE is configured to re-emit substantially in the red wavelength range; and,
the third WCE is configured to re-emit substantially in the green wavelength range,
wherein the total light emitted by the module further comprises the light generated from the third LED and WCE and the module is configured to emit total light having the predefined colour chromaticity when one or more activation properties of the third LED are also managed.

In a preferred embodiment the first, second or third semiconductor LED may comprise an array of multiple LED die.

Preferably, light generated by the first, second and third semiconductor LEDs and by the first, second and third WCEs is combined to form a total emitted light having a broad white emission spectrum. The white light emission is achieved by combining the correct proportion of light from the first, second and third LED sub-module using a control system.

In a first particular embodiment, the first LED sub-module is a white emission sub-module and comprises a blue semiconductor LED and a yellow phosphor or fluorophore. The second LED sub-module has a dominant emission wavelength in the Red-Orange and comprises a blue semiconductor LED and a Red-Orange phosphor or fluorophore. The third LED sub-module has a dominant emission wavelength in the Green and comprises a blue semiconductor LED and a Green phosphor or fluorophore. The first, second and third LED module may further comprise a blue optical bandstop filter. The LED module is designed to enable total emitted light having a white light emission with a tunable CCT of greater than 100K. The white light emission is achieved by combining the correct proportion of light from the first, second and third LED sub-module using a control system.

In a second particular embodiment, the first LED sub-module is a white emission sub-module and comprises a blue semiconductor LED and a yellow phosphor or fluorophore. The second LED sub-module has a dominant wavelength in the Red-Orange emission and comprises a blue semiconductor LED and a Red-Orange phosphor or fluorophore. The third LED sub-module has a dominant emission wavelength in the Yellow and comprises a blue semiconductor LED and a Yellow phosphor or fluorophore. The first, second and third LED module may further comprise a blue optical bandstop filter. The LED module is designed to enable total emitted light having a white light emission with a tunable CCT of greater than 100K. The white light emission is achieved by combining the correct proportion of light from the first, second and third LED sub-module using a control system.

In a third particular embodiment, the first LED sub-module is a yellow emission LED sub-module comprising a blue semiconductor LED and a yellow phosphor or fluorophore. The second LED sub-module has a dominant emission wavelength in the Red-Orange and comprises a blue semiconductor LED and a Red-Orange phosphor or fluorophore. The third LED sub-module has a dominant emission wavelength in the blue and comprises a blue semiconductor LED. The first, second and third LED module may further comprise a blue optical bandstop filter. The LED module is designed to enable the total emitted light to have a white light emission with a tunable CCT of greater than 100K. The white light emission is achieved by combining the correct proportion of light from the first, second and third LED sub-module using a control system.

In a fourth particular embodiment, the first LED sub-module is a yellow LED sub-module and comprises a blue semiconductor LED and a yellow phosphor or fluorophore. The second LED sub-module has a dominant emission wavelength in the Red-Orange and comprises a blue semiconductor LED and a Red-Orange phosphor or fluorophore. The third LED sub-module has a dominant emission wavelength between the green and blue and comprises a blue semiconductor LED and a Green phosphor or fluorophore. The first, second and third LED module may further comprise a blue optical bandstop filter. The LED module is designed to enable the total emitted light to have a white light emission with a tunable CCT of greater than 100K. The white light emission is achieved by combining the correct proportion of light from the first, second and third LED sub-module using a control system.

In some embodiments the first LED sub-module may further comprise an optical filter. The optical filter is at least partially in the path of the light emitted by the first semiconductor LED and the light emitted by the first WCE. The optical filter may be disposed proximal to the first WCE and distal to the first semiconductor LED. In some embodiments, the optical filter may be disposed between the first semiconductor LED and the first WCE.

Likewise, in some embodiments, the second LED sub-module may further comprise an optical filter. This optical filter is at least partially in the path of the light emitted by the second semiconductor LED and the light emitted by the second WCE. The optical filter may be disposed proximal to the second WCE and distal to the second semiconductor LED. In some embodiments, the optical filter may be disposed between the second semiconductor LED and the second WCE.

In embodiments comprising a third LED sub-module, this third sub-module may further comprise an optical filter. This optical filter is at least partially in the path of the light emitted by the third semiconductor LED and the light emitted by the third WCE. The optical filter may be disposed proximal to the third WCE and distal to the third semiconductor LED. In some embodiments, the optical filter may be disposed between the third semiconductor LED and the third WCE.

In one preferred embodiment each of the first, second and third LED sub-module comprises an optical filter. The optical filter is at least partially in the path of the light emitted by the first, second and third semiconductor LED and the light emitted by the first, second and third WCE. The optical filter may be disposed proximal to the WCE and distal to the semiconductor LED residing in each LED sub-module. In some embodiments, the optical filter may be disposed between the semiconductor LED and the WCE residing in each LED sub-module.

Suitable optical filters may be selected from a group of optical filters including dichroic filters, multilayer stack filters, colour corrector filter, colour absorbing filters, diffuser filters, dye based filters, pigment based filters, diffraction based filters and refraction based filters.

One or more of the optical filters may comprise a structure selected from a group of such as a gel based layer, a multilayer stack disposed on a glass sheet, a multilayer stack on a polymer film, a stack disposed directly on the LED sub-mount or pigment in-filled glass or polymer.

Further LED sub-modules may be included in the overall LED module, each having an LED emitting at other desirable wavelengths. If required, a suitable WCE element may be included in the further sub-modules.

In a preferred embodiment, the module further comprises a fourth LED sub-module disposed on the high thermal conductivity sub-mount, the fourth LED sub-module comprising:
  a fourth semiconductor LED for generating light when activated, the fourth LED being in thermal contact with the sub-mount and comprising the same semiconductor material system as the first, the second and, if present, the third semiconductor LED; and,
  a fourth high thermal conductivity reflector cup, the fourth LED being disposed in the fourth reflector cup,
  wherein, upon activation, the first, the second and, if present, the third semiconductor LED emit light in the blue wavelength range, and the fourth semiconductor LED emits light in the near UV or red-shifted blue wavelength range substantially different to the blue wavelength emitted by the first, the second and, if present, the third semiconductor LED, and
  wherein the total light emitted by the module further comprises the light generated from the fourth LED and the module is configured to emit total light having the predefined colour chromaticity when one or more activation properties of the fourth LED are also managed.

This embodiment provides for further control and tuning of the chromaticity of the total emitted light.

According to a second aspect of the present invention, a controlled LED module system comprises:
  an LED module according to the first aspect of the present invention; and,
  a control system for managing activation properties of the semiconductor LEDs in the LED module when activated, the control system being adapted to manage the activation properties to achieve the predefined colour chromaticity for the total light emitted by the LED module.

Preferably, the control system is further adapted to monitor electrical and thermal properties of the semiconductor LEDs in the module and to provide feedback to modify activation properties of the semiconductor LEDs in order to achieve the predefined colour chromaticity for the total light emitted by the LED module.

Preferably, the controlled LED module system further comprises a light sensor oriented to measure the colour chromaticity properties of at least part of the total light emitted by the module, the control system being coupled to the light sensor and adapted to provide feedback to modify activation properties of the semiconductor LEDs to achieve the predefined colour chromaticity for the total light emitted by the LED module.

The control system may further include an interface for connecting the control system to external sources and receiving information from the external sources.

Preferably, the total emitted light approximately resides along the Planckian locus on a colour chromaticity diagram and within a chromaticity rectangle bounded by the CIE (x, y) coordinates (0.300, 0.300) and (0.525, 0.450).

According to a third aspect of the present invention there is provided a method of manufacturing the LED module of the first aspect or the controlled LED module system of the second aspect, the method comprising the steps of:

die attaching a first LED and second LED on a sub-mount;
    affixing a first reflector cup around the first LED;
    affixing a second reflector cup around the second LED;
    depositing a first WCE element on at least a surface of the first LED and residing inside the first reflector cup; and,
    depositing a second WCE element on at least a surface of the second LED and residing inside the second reflector cup.

Preferably, when manufacturing the controlled LED module system, the method further comprises the steps of:

assembling a control system and interfacing it to the first and second LED; and,
    presetting parameters in the control system, whereby the control system is adapted to manage the activation properties of the semiconductor LEDs in the LED module to achieve the predefined colour chromaticity for the total light emitted by the LED module.

As will be appreciated by those skilled in the art, the present invention provides the benefits of a low cost LED module with uniform chromaticity properties in the far field and having long and controlled lifetime yet also offer the flexibility and intelligence of tunable colour chromaticity, CRI and intensity either at manufacture or in the end user lighting application. As indicated above, the invention can be implemented in a wide range of configurations and various embellishments of the invention are possible, many of which are described below with reference to the drawings.

BRIEF DESCRIPTION OF THE DRAWINGS

Examples of the present invention will now be described in detail with reference to the accompanying drawings, in which.

DETAILED DESCRIPTION OF THE INVENTION

The object of the present invention is to provide a high wall plug efficiency low cost, low thermal resistance LED chip on board (COB) module and control system having a light output that is flexible and intelligent capable of tuning colour chromaticity, CRI and intensity. The tunability is defined by the control system and may be pre-set during manufacture or actively defined or monitored in the end user lighting application.

The present invention can be incorporated using a light emitting device (LED) of any semiconductor material system such as, but not restricted to, InGaN, InGaP, InGaAs, InP, or ZnO. However, for illustrative purposes and as a preferred example, Blue wavelength InGaN semiconductor LED having a vertical contact pad structure (sometimes termed vertical LED structure, or thin GaN) will be described in the bulk of the detailed description of the invention.

Figure 2A:
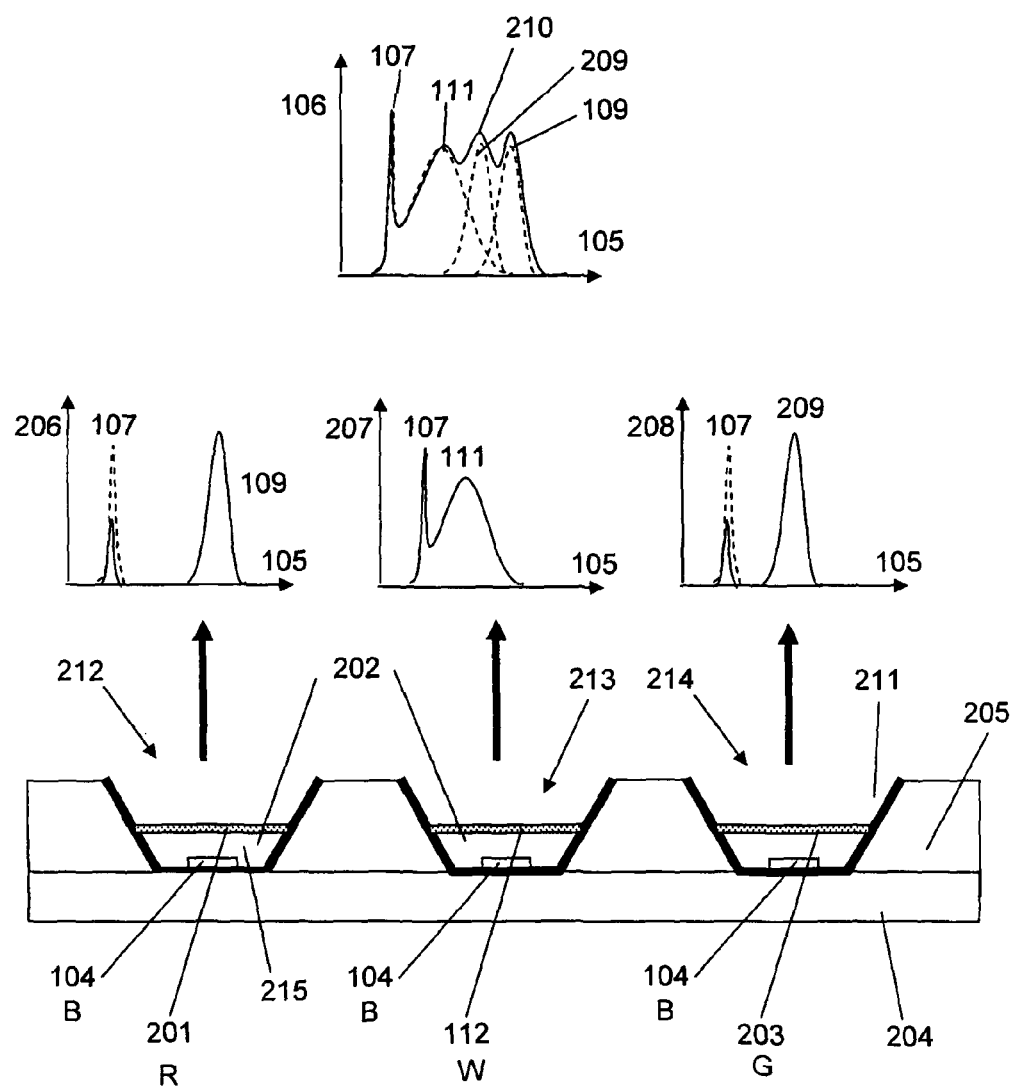
FIG. 2a shows a schematic cross section of an example LED module of the present invention.

In the first aspect of the present invention an LED COB module is devised, as shown in FIG. 2a. The LED die, 104, are die bonded using soldering, epoxy or any other attach process onto an electrical circuit board, 204. Preferably, the electrical board comprises an insulated metal substrate (IMS) board. The electrical board comprises an electrical tracking layer (typically comprising a Cu alloy for improved thermal and electrical properties), which is employed to supply electrical connection to the ohmic contacts of the LED die. The p-contact of the LED die is attached to an electrical tracking layer that also introduces a first layer of horizontal thermal spreading. The board also comprises an electrical insulating layer disposed between the electrical tracking layer and a thermally conductive sub-mount or substrate layer.

An LED COB module provides many benefits, whereby the direct attach of the LED die to the electrical board or substrate layer removes many interface layers that provide undesirable thermal interfaces thus simplifying packaging and dramatically reducing manufacturing costs.

The LED module further comprises a thermally conductive reflector cup assembly system, 211, affixed to the submount and aligned so that the individual LED die reside in separate reflector cups.

A wavelength converting element (WCE), 201 and 112 and 203, is subsequently disposed inside the reflector cups. This may comprise of a phosphor, QDs, organic light emitting material or other electrically, ionically or optically pumped light emitting material.

Each individual LED and associated wavelength converting element residing in a reflector cup is termed the LED sub-module, 212, 213 and 214.

In the present invention, at least two LED sub-modules having different WCE elements are employed. In the preferred example described in FIG. 2a three LED sub-modules are incorporated into the LED module. Each LED sub-module comprises an identical semiconductor LED die, 104 and a different WCE element (namely 201, 112 and 203).

Firstly, a white LED sub-module, 213, comprising a blue semiconductor LED, 104 and yellow phosphor, 112, is employed to achieve substantially white light emission. A high efficiency yellow phosphor is employed aimed at achieving a cool colour temperature ranging between 10,000K and 5,500K when the blue LED optically pumps the phosphor. It is an object of the white LED sub-module, 213, to achieve maximum luminous efficiency with minimal concern about achieving a specific high CRI number or a well defined colour chromaticity on a CIE diagram. The characteristic white light emission intensity profile, 207, is plotted against wavelength, 105. The yellow emission component, 111, typically having a peak wavelength ranging between 545 nm and 580 nm is superimposed on the blue wavelength emission 107. It is apparent from the peak widths of 107 and 111 that to provide a broad white light emission simulating daylight the broad phosphor emission of 111 is preferred.

In a preferred example the white LED sub-module emits light having a colour residing in a rectangle bounded by the CIE (x, y) (0.00, 0.00) and (0.350, 0.350) while having luminous efficiency at least greater than 100 lm/W at 350 mA current drive for LED 104.

Secondly, a red LED sub-module, 212, is formed of a blue semiconductor LED, 104 and substantially red phosphor, 112, are employed to achieve substantially red light emission. The red phosphor centre wavelength emission, 109, may range between 580 nm and 670 nm as shown on 206. It is also an object of the invention that the emission from 104 is dramatically decreased by improving 104 pump coupling efficiency to the Red phosphor, 201. This is experienced by having a drop in the peak emission of blue emission 107 on plot 206. This is desirable in order to avoid increased blue component dominance in the total emitted light of 106 in FIG. 2a.

Thirdly, a green LED sub-module, 214, is formed of a blue semiconductor LED, 104 and substantially green phosphor, 209, which are employed to achieve substantially green light emission. The green phosphor centre wavelength emission, 209, may range between 500 nm and 545 nm as shown on 208. It is also an object of the invention in the case of the green LED sub-module that the emission from 104 is dramatically decreased by improving 104 pump coupling efficiency to the green phosphor, 203. This also is desirable in order to avoid the increased blue shift of the resulting total emitted light on the CIE diagram.

During operation the white LED sub-module and the red and green LED sub-modules are all electrically driven and the total emitted light will comprise a cool white light mixed with red and green light emission forming a warmer white colour. The resulting light will shift the (x, y) colour coordinates towards the Red region of the CIE diagram if the Red sub-module intensity is increased while a predominant shift towards the Green region of the CIE diagram is experienced if the Green LED sub-module intensity is increased.

In practical terms, if the white light component is centered on (x=0.35, y=0.35), the relative shift in the x coordinate, $\Delta x$, is a positive finite number and the relative shift in the y coordinate, $\Delta y$, is a negative number if the red component is increased, while in the case of the increasing the green component the $\Delta x$ is a negative finite number and $\Delta y$ is a positive number.

The spectrum of the total emitted light, solid line 210, from the LED module is shown in the graph 106 in FIG. 2a. The broad emission, typically greater than 40 nm and preferably greater than 50 nm, from the yellow, green and red phosphor are arranged to overlap and provide a continuous summation of emitted light closely resembling 120 and providing superior CRI. Preferably, the CRI is greater than 85, greater than 90, and greater than 92.

In a preferred aspect of the present invention the total emitted light emitted is substantially white and approximately resides along the Planckian locus on a colour chromaticity diagram and at least within a chromaticity rectangle bounded by the CIE (x, y) coordinates (0.300, 0.300) and (0.525, 0.450).

Figure 2B:
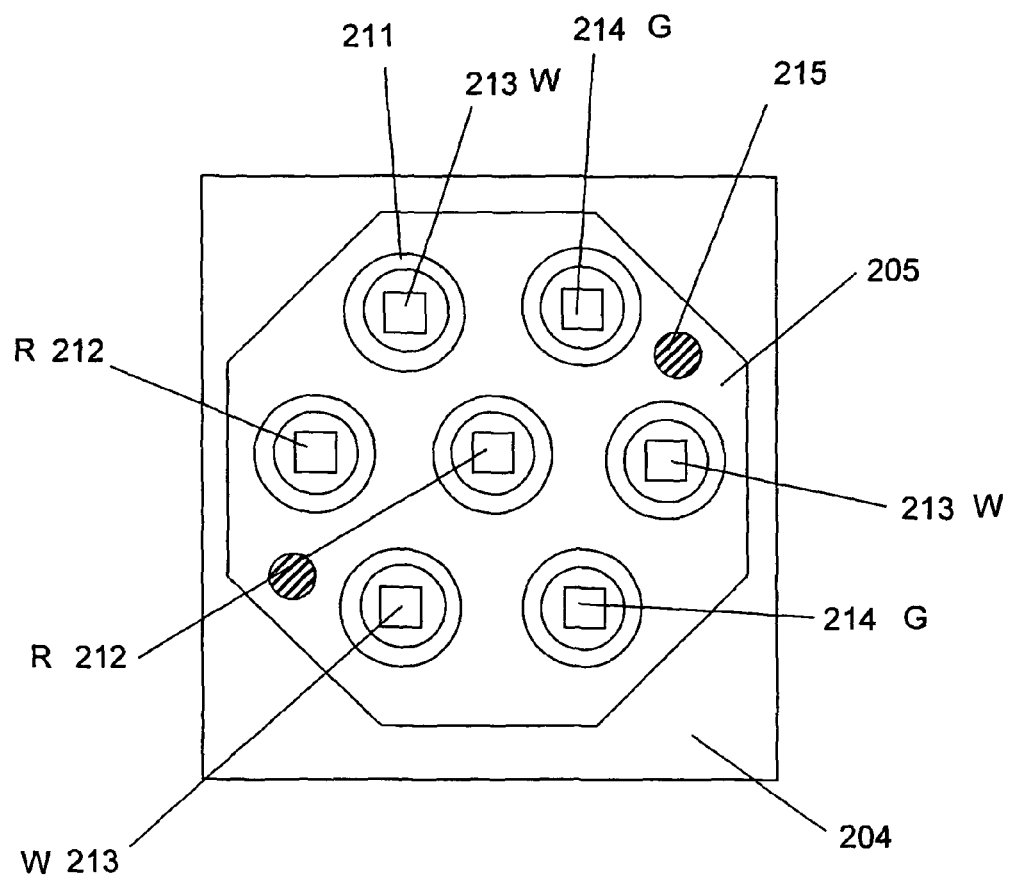
FIG. 2b shows a schematic top view of an example LED module of the present invention.

The plan view of an example LED module of the present invention is shown in FIG. 2b. Multiple LED sub-modules are formed on a single submount having electrical tracking 204. The multiple reflector cups, 211, are formed from a single metal sheet having high thermal conductivity for improved thermal dissipation from the LED die and WCE element. For increased power output and uniform white light generation 3 white LED sub-modules, 213, as well as 2 green, 214, and 2 red, 212, LED sub-modules are formed. Further holes are located, 215, and employed for physical attach of the LED module to a luminaire or heat sink. The location and size can vary depending on the application and the final end product.

The LED die residing in each reflector cup may further comprise of clusters or arrays of smaller multiple LED die or large single power LED chips. An array of arbitrary shaped LED die may also be employed such as rectangular, square or polygonal shaped LED die. In a preferred example the LED power chip dimensions is 1 mm×1 mm, 1.5×1.5 mm, 2.2×2.2 mm.

Figure 1A:
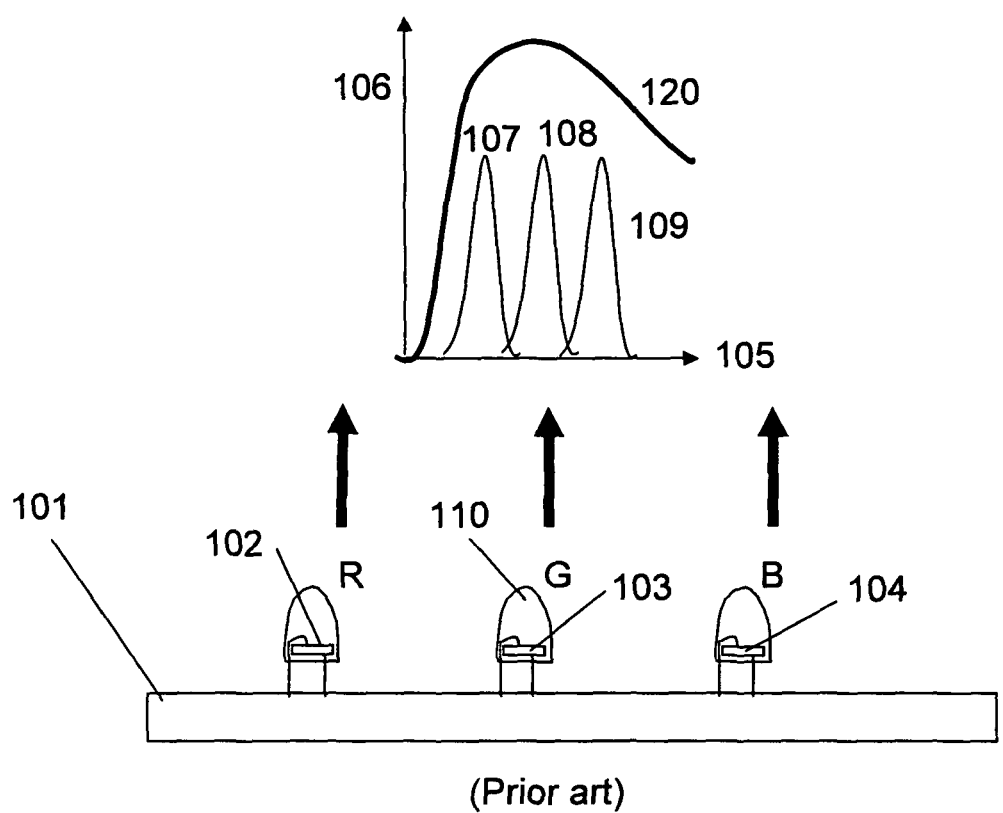
FIG. 1a (prior art) shows a first known LED module.
Figure 1B:
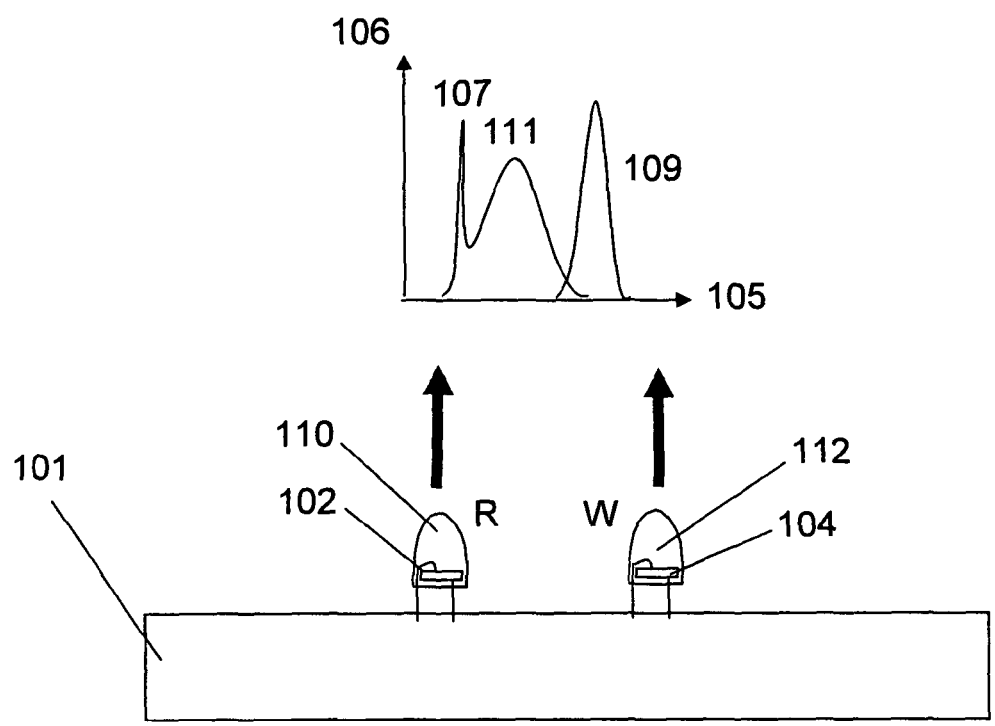
FIG. 1b (prior art) shows a second known LED module.
Figure 1C:
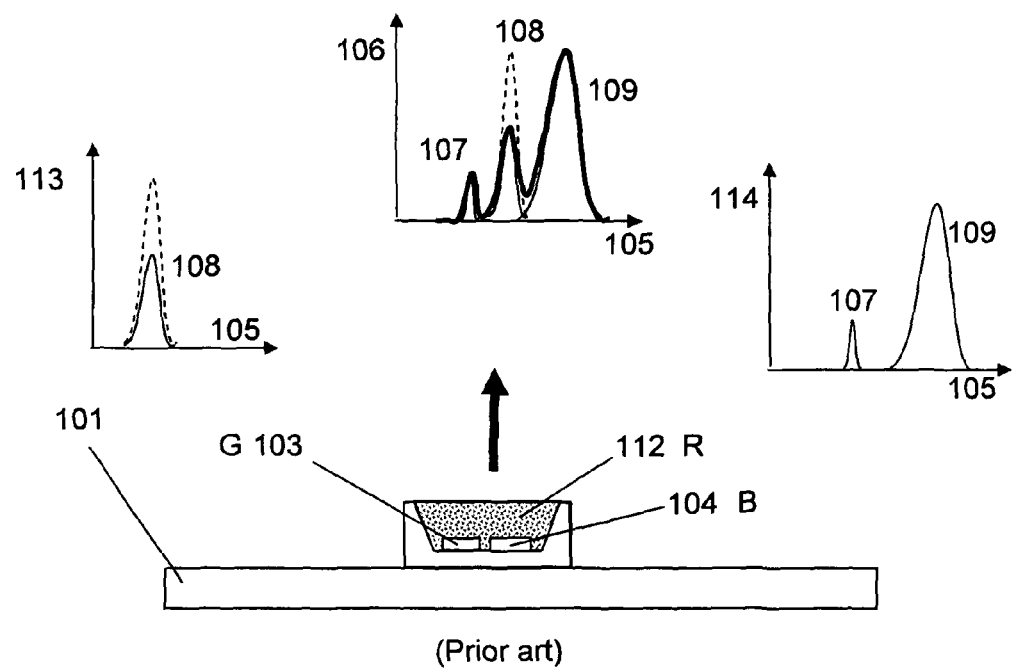
FIG. 1c (prior art) shows a third known LED module.
Figure 1D:
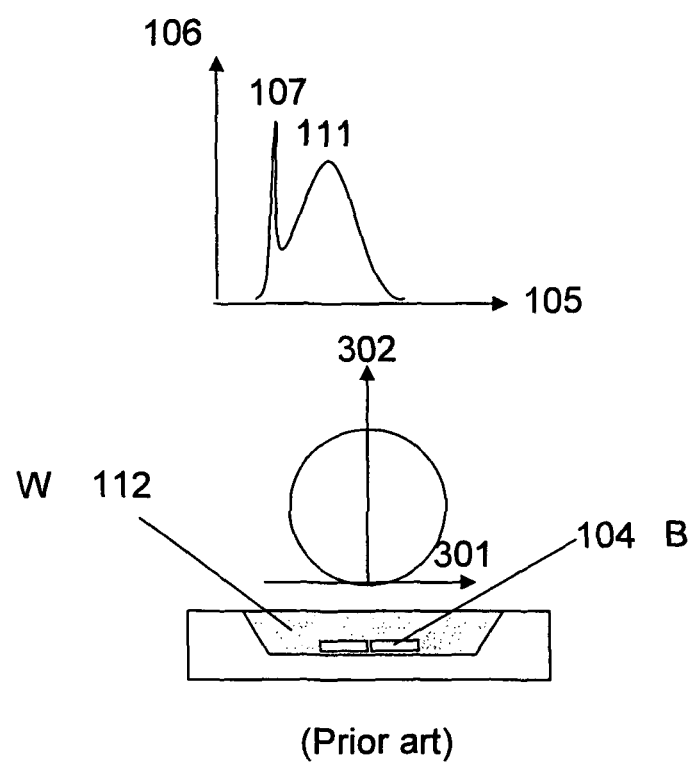
FIG. 1d (prior art) shows a known LED module.

Conventional LED modules having an LED die and WCE emit light in a Lambertian profile, this is shown in FIG. 1d. The far field profile of a typical system is plotted as light intensity, 301, against angle, 302 (as a polar plot) and has a full width half maximum (FWHM) of 120 degrees as shown in the insert in FIG. 1d. In such a typical white LED module an LED die or cluster of dies are typically arranged in a compact array with a phosphor disposed on the surface. The close proximity of the LEDs and the single phosphor composition residing on all the LEDs enables the LED module to emit as a single light source. This allows the LED module to exhibit uniform colour chromaticity versus far field angle in a Lambertian profile. The summation of light emanating from individual LED modules separated by a finite distance introduces large variations in colour chromaticity versus emission angle. This is especially true when the observation point is of the order of the separation distance of the individual LED modules and when the LED modules emit light of different wavelengths.

Figure 3A:
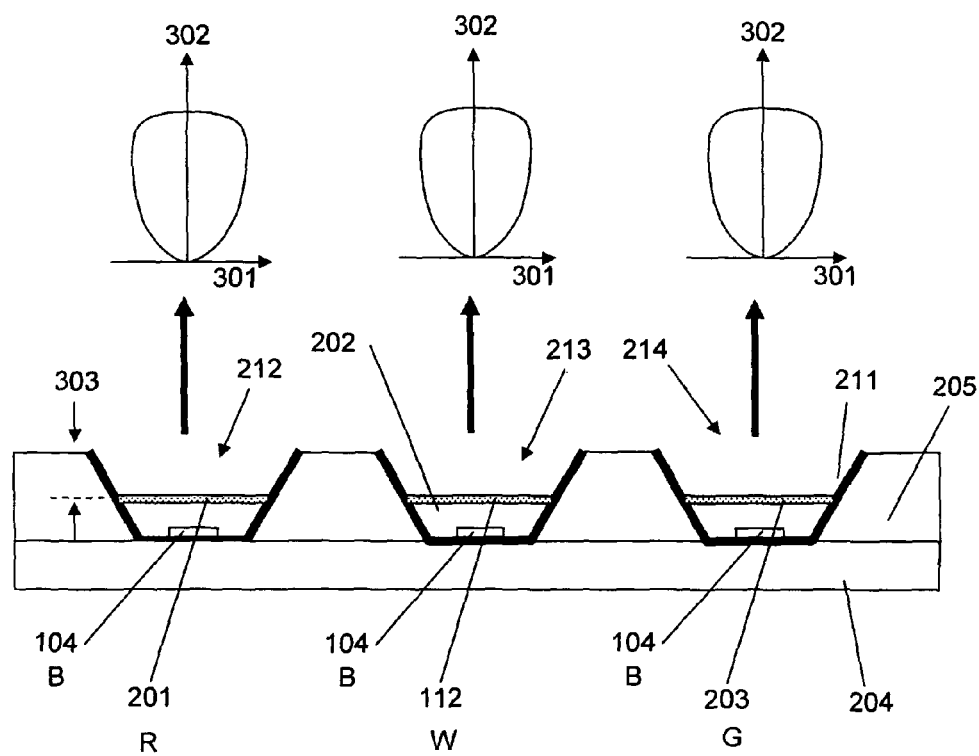
FIG. 3a shows a schematic cross section of an example LED module of the present invention having associated far field emission profiles.

In a preferred example of the present invention the LED module comprises LED die residing in individual reflector cups with the WCE disposed inside the reflector cup as shown in FIG. 3a. The clearance formed between the top surface of the WCE element and the top edge of the reflector cup, 303, enables light incident on the reflector cup from the WCE to be reflected and collimated.

Figure 3B:
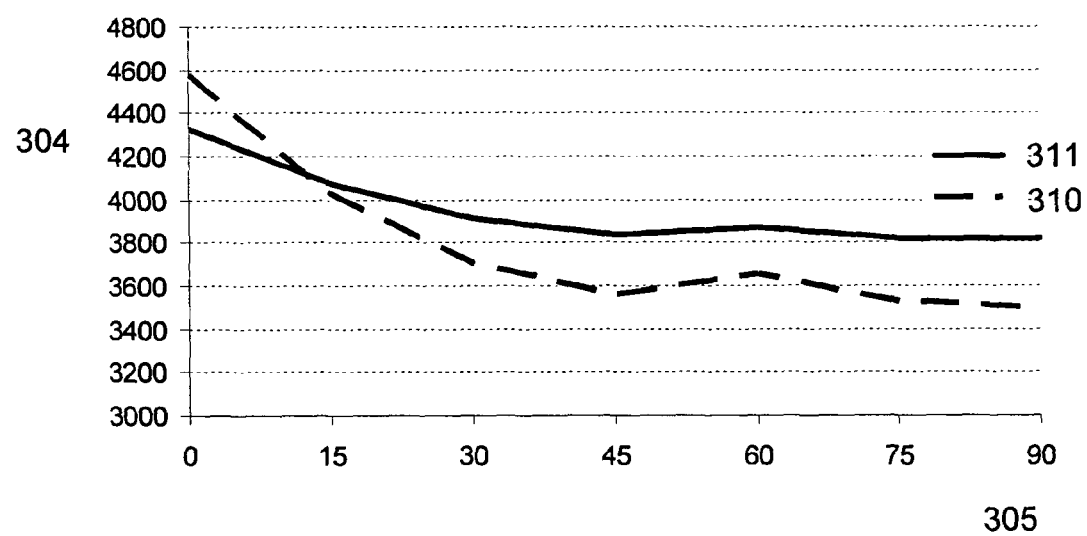
FIG. 3b shows a graph of correlated colour temperature (CCT) against far field angle.

The summation of light emanating from individual reflector cups in the far field can typically cause variations in colour chromaticity versus far field angle. FIG. 3b shows the difference in corrected colour temperature (CCT) of an LED module of the present invention as compared with an LED module of the prior art. The colour chromaticity variation in the far field is affected by two factors. The variations in wavelength spectra emitted from different reflector cups as well as separation distance between different reflector cups. These two criteria introduce large variations in chromaticity in the far field especially at large far field angles (FIG. 3b). The artifacts are reduced when the emission is more collimated than Lambertian. It is important to note that the larger the separation between the LED die and WCE the higher collimation is needed to improve chromaticity.

The LED module chromaticity uniformity is also greatly improved as the distance between the observer and the LED module is increased. In the case of the prior art an RBG module, 311, having spacing of 9 mm between each individual R, G and B LED die is analyzed at an observation distance of 100 mm away. Similarly, the CCT vs far field angle is analyzed for the LED module of the present invention, 310, with an identical spacing to the prior art between the Blue, Red and Green LED sub-modules. Inspecting the graph indicates the improvement in CCT, 304, against observer angle, 305, uniformity when increased collimation in the total emitted light is introduced. It is important to note that, for comparison purposes, the LED module of the present invention does not include a White LED sub-module.

The reflector cup properties allows for the ability to modify the far field emission profile as well as improve collimation. The reflector cup surface finish may be specular, multi-faceted, textured or diffuse. The reflector cup cone angle, material reflectivity as well as surface finish are designed to provide a far field pattern more collimated than a Lambertian source as well as improve light extraction from the optical cavity formed. The reflector cup vertical cross section profile may comprise but not restricted to parabolic, spline curves or multiple straight sections. The reflector cup horizontal cross section profile may be composed but not restricted to hexagonal, polygonal, elliptical or circular profiles. The reflector cup may also be composed of a multiple part reflector system, where for example a first part comprising of a smaller reflector cup or light pipe propagates and guides light into a secondary reflector cup designed for improved light collimation.

Figure 4:
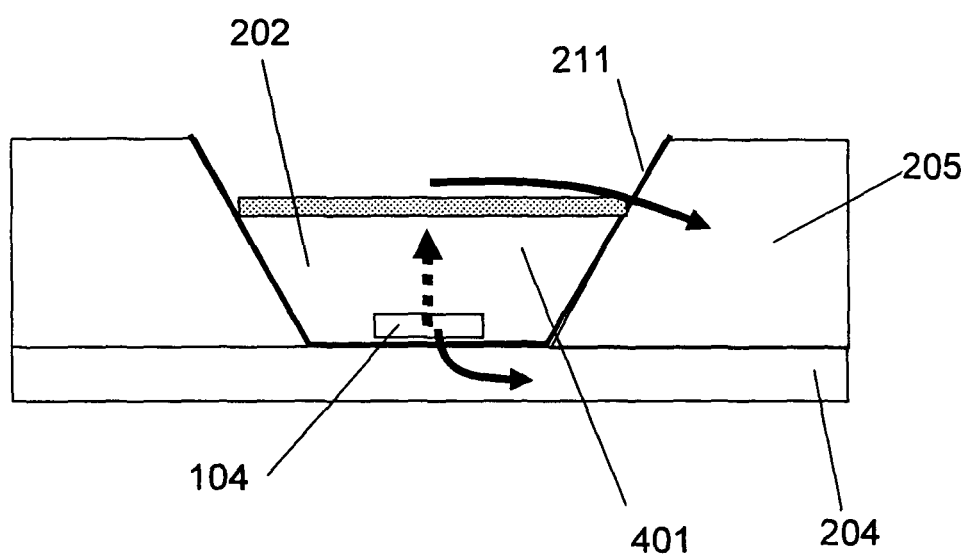
FIG. 4 shows a schematic cross section of an example LED module of the present invention with enhanced thermal dissipation aided by the sub-mount and reflector cup.

In a preferred aspect of the invention, the sub-mount and reflector cup comprise aluminum metal for improved thermal dissipation. During operation, the high power densities injected into the LED generate heat at the LED junction. It is also important to note that due to the high light output densities generated by the LED the WCE element also generates heat due to photon absorption resulting in some phonon vibrations and non-radiative recombinations in the host material. WCE elements are typically prone to thermal de-rating where an increase in the temperature of the WCE element reduces the quantum efficiency of the WCE. If the heat is not efficiently dissipated from both the LED and WCE element the efficiency of the LED and the WCE degrades as well as the lifetime of the semiconductor and WCE. Additionally, as the degradation in efficiency is not linear, drifts in colour may also be experienced. This is not desirable and hence it is an object of the present invention that a high thermal dissipation sub-mount, 204 and reflector cup, 205 is employed as shown in FIG. 4. It is also an object of the present invention that the LED is in physical contact with the sub-mount for maximum thermal dissipation and at least part of the WCE element is in contact with the reflector cup as shown by the solid lines.

In a preferred aspect of the invention, the sub-mount and reflector cup comprise a high thermal conductivity metal, metal alloy or ceramic such as Al, Cu, W, Ag, AlN, $Al_2O_3$, Si or SiC as well as compounds including Chemical Vapour Deposited (CVD) diamond and Diamond like Carbon (DLC).

In another preferred embodiment of the present invention, the sub-mount and/or reflector cup comprise of a material having thermal conductivity greater than 50 W/mK, preferably greater than 150 W/mK.

In yet another preferred aspect of the present invention a first encapsulant layer, 401, is disposed between the WCE element and the semiconductor LED to enable remote WCE operation. The encapsulant comprises of an optically transparent, low thermal dissipation polymer, silicone, resin, plastic or inorganic high refractive index material. This allows for protection of the LED die from environmental factors, improved light extraction from the LED die, as well as for improved thermal isolation between the WCE and the LED. The thermal interface generated between the WCE and the LED enables the WCE to operate at a much lower ambient temperature improving quantum efficiency and lifetime of the WCE. The control of the thickness of the first encapsulant also allows for modification of the height of the WCE in the reflector cup and ultimately the collimation of the total emitted light.

Figure 5:
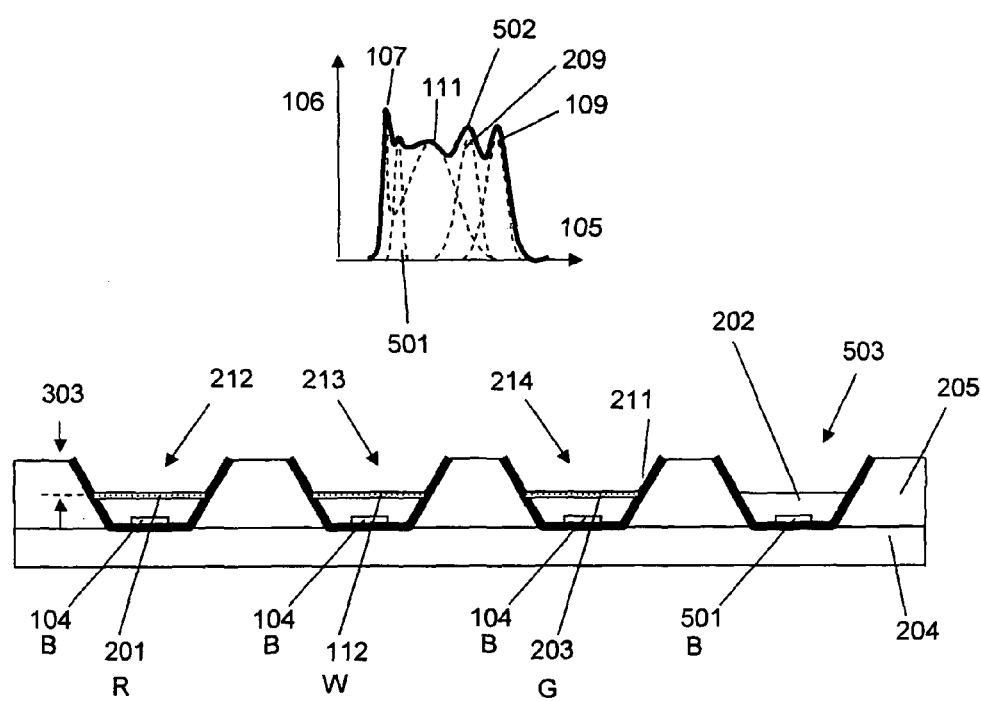
FIG. 5 shows a schematic cross section of another example LED module of the present invention.

In another aspect of the present invention, the addition of a further blue emission LED sub-module, 503, is included as shown in FIG. 5. The additional semiconductor LED preferably comprises of a blue emission, 501, centered between the peak wavelength of 111 and the peak wavelength of 107. This is designed to enable further improvements in the CRI to achieve values greater than 90 where the total emitted light, 502, is adapted to simulate a black body radiation. In a further aspect the LED module may additionally further comprise of an LED sub-module containing a near UV LED die. Near UV LED emission typically range between approximately 300 nm and 430 nm. The addition of near UV emission is advantageous in applications where the wavelength spectrum of daylight is to be replicated such as for skin treatments, dental, wellbeing and health applications.

State of the art Red semiconductor LED wall plug efficiencies (WPE) are approximately 27% to 30% depending on the wavelength. However, in one embodiment of the present invention a Blue GaN based LED (having external quantum efficiency of approximately 45%) with a Red WCE element comprising a material such as a Red QD or Red phosphor (having conversion efficiency of approximately 85%) demonstrates a total efficiency (WPE) greater than 38%. This amounts to greater than 26% improvement in overall efficiency of the lighting system. The wavelength-converted Red light emission also comprises of a broader emission spectrum (typically greater than 40 nm) improving the overlap of the emitted spectrum the Red LED sub-module.

It is a feature of the present invention that the individual WCE elements emitting at specific wavelength bands are separated in individual reflector cups to further reduce the scattering exhibited by the finite size of the WCE colloids or clusters. WCE are optimised to generate optimal light at a specific wavelength emission band, part of the optimization includes modification of the colloid or cluster sizes to reduce scattering effects experienced by the light propagating through the WCE. However, this is typically performed to enhance transmittance of light at the emission band of the WCE and due to Mie scattering effects, and the transmittance cannot be optimised for other wavelength ranges.

This is particularly relevant for WCE elements comprising of Quantum dots or nanocolloids where the size of the emitting particle is of the order of wavelength of the emitted light. Hence, by disposing WCE elements with similar emission spectra in the same reflector cups the total emitted light efficiency is further enhanced. The WCE elements may comprise of host materials formed of colloids, nanoshell, nanorice, nanocolumns or alternatively macroporous structures.

In a second aspect of the present invention the LED module may be provided with a control system. The control system may contain a microcontroller, an array of LED drivers, memory, and multiple input and output channels. The control system is employed to provide the semiconductor LEDs with the desired current or voltage drive intensity to enable a pre-defined colour chromaticity from the LED module to be achieved.

In a preferred example the LED module is factory pre-set to a predefined colour chromaticity, CRI and light output for a given input power. The LED module further comprises a control system. During manufacture, the control system is trimmed while externally monitoring the total emitted light colour chromaticity, total light output as well as the CRI for the LED module. Once the predetermined chromaticity characteristics are achieved in the LED module no additional trimming or modifications are required and the LED module is finalized.

Figure 6A:
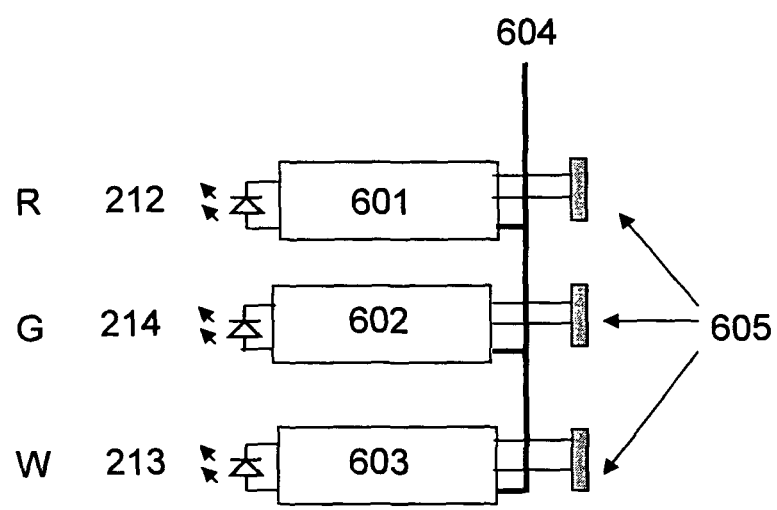
FIG. 6a shows a schematic diagram of an example LED module and control system of the present invention.

An example of a simple control system is shown in FIG. 6a. The control system may comprise of an array of LED drivers for each of the Red LED sub-module 212, the Green LED sub-module 214 and the White LED sub-module 213, each having individual components that may be modified (by means of tuning or trimming a characteristic such as resistance or capacitance), 605, to enable each driver to generate a different power output. One example method of pre-setting the colour chromaticity of the LED module is by use of active laser resistor trimming while monitoring of the light output characteristics of the LED module. A trimming resistor is connected to the feedback circuit of each red, 601, green 602 and white 603, LED driver allowing individual control of the intensity of each wavelength spectrum.

Figure 6B:
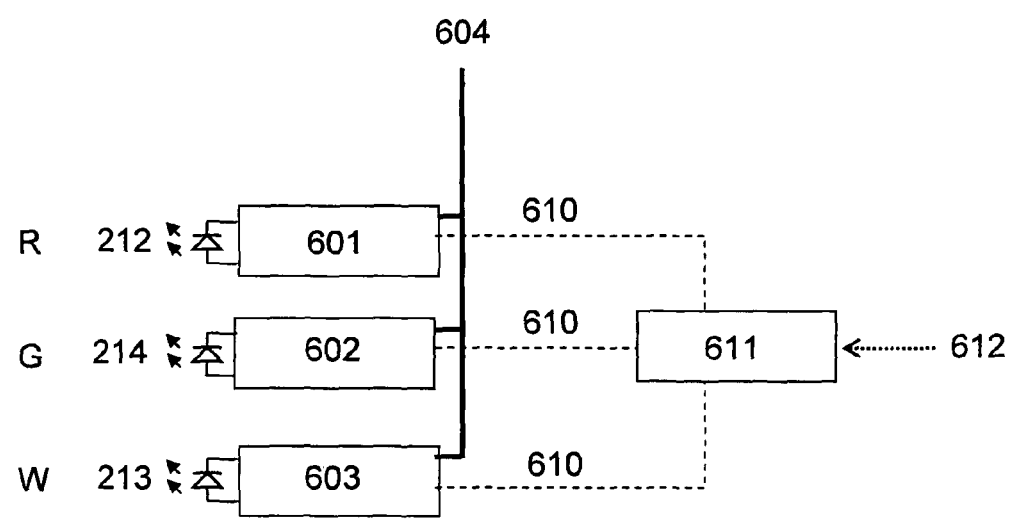
FIG. 6b shows a schematic diagram of another example LED module and control system of the present invention.

In another preferred example of pre-setting the colour chromaticity, a microcontroller, 611, is employed (as shown in FIG. 6b) to control the dimming input, 610, of the LED drivers of each colour LED sub-module. Instead of active laser trimming of the resistor the microcontroller is programmed to include the exact dimming control signal to achieve the correct LED power intensity. An interface, 612, for factory pre-setting is also included.

Figure 6C:
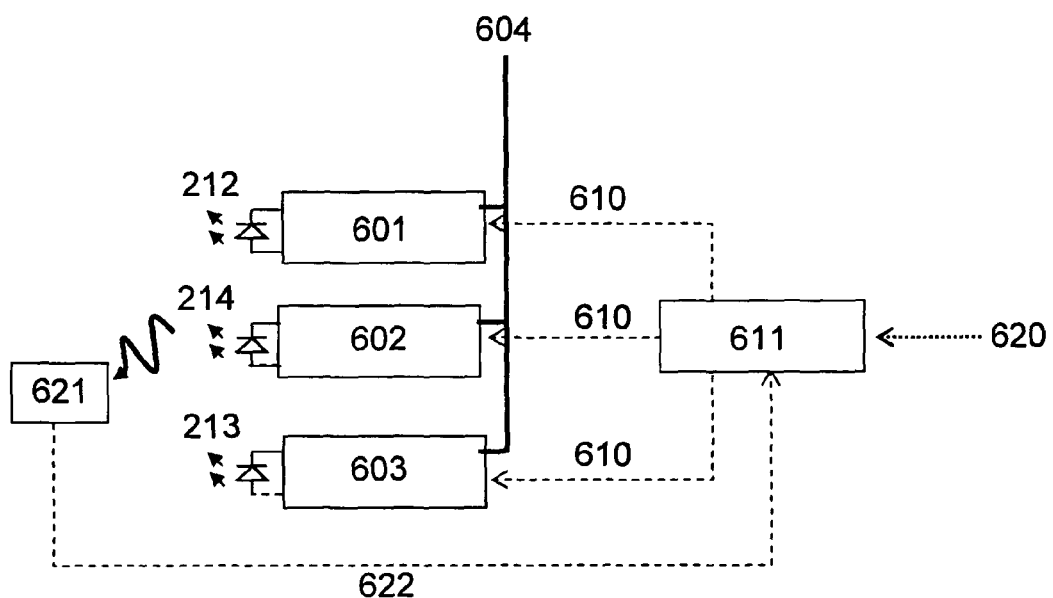
FIG. 6c shows a schematic diagram of another example LED module and control system of the present invention.

In another embodiment of the controlled LED module system, the control system may also include a feedback loop. The feedback signal is achieved by use of an optical colour sensor as shown in FIG. 6c. A percentage of the total emitted light is allowed to incident the colour sensor, 621. The signal is fed back, 622, into the controller, 611. This data is processed with pre-calibrated algorithms embedded in the controller allowing the LED module to be adjusted for any deviations or drifts in colour chromaticity. The dimming lines of the LED drivers, 610 are accordingly adjusted by the controller. An interface, 620, is also provided for factory calibration algorithm downloads.

The optical colour sensor may comprise of but not limited to a light sensor that analyses a component of the spectral content of the total emitted light, an array of photodiodes coupled to colour filters or gratings, CCD array, photodetector, bandpass filters or a spectrometer.

Figure 6D:
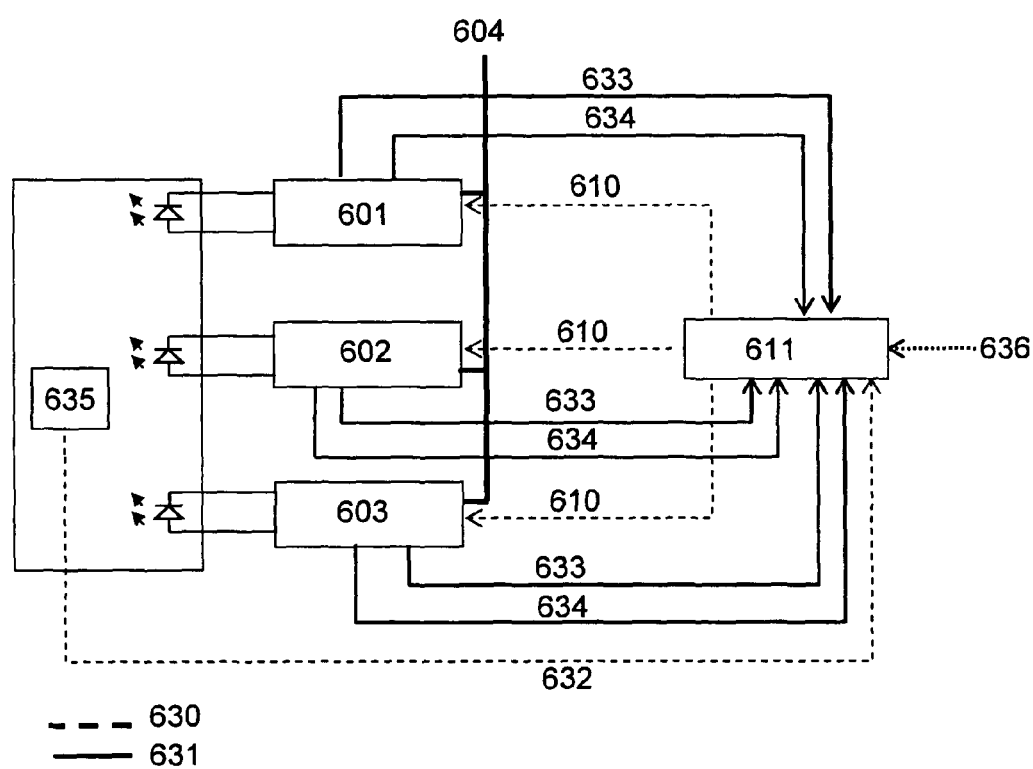
FIG. 6d shows a schematic diagram of another example LED module and control system of the present invention.

In a further aspect of the present invention the feedback signal is indirectly determined from secondary sensors. This is achieved by use of a temperature, voltage and current sensor as shown in FIG. 6d. These sensors monitor the individual LED die for changes in operating temperature, 635, voltage, 633, and current, 634, across the lifetime and build a parameter database in the controller memory. The temperature sensor may be externally attached to the submount on the electrical board. The object of the present invention can only be achieved due to the use of identical semiconductor LED die. During operation, the database of the properties is stored and continually monitored in the microcontroller which determines the degradation of the LED and WCE due to lifetime and operating temperature and is achieved by comparison to reference databases stored in the microcontroller and the current for individual LEDs is adjusted using dimming, 610, to indirectly correct the colour chromaticity of the total emitted light. The interface, 636, is also provided for factory calibration algorithms and colour controls.

Figure 6E:
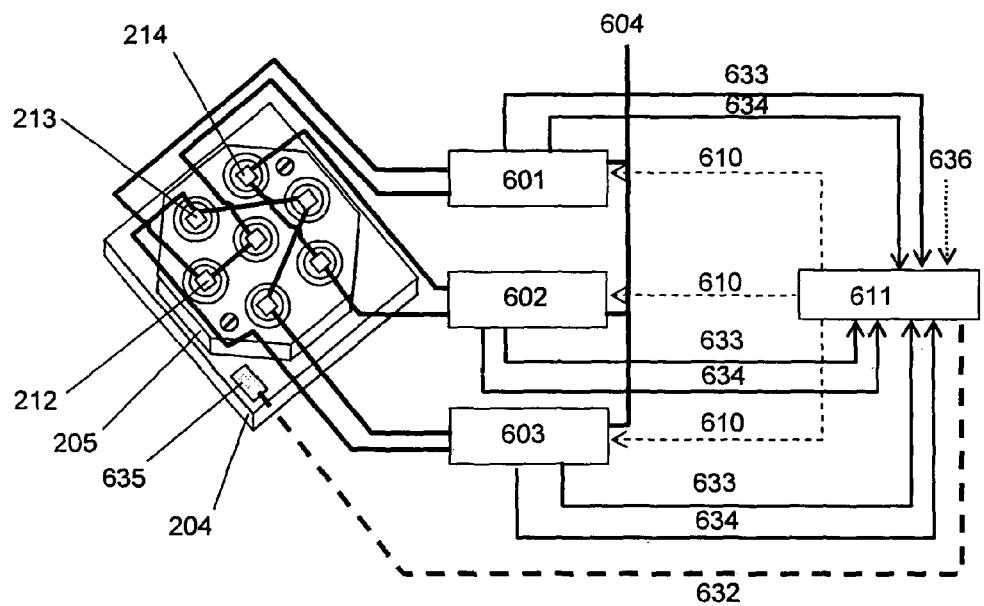
FIG. 6e shows a schematic diagram of another example LED module and control system of the present invention; and,
FIG. 7 shows a flow diagram of a method of manufacture of the present invention.

FIG. 6e highlights a schematic of the LED module of the present invention with a control system further including temperature, voltage and current feedback. In the present example, multiple Red, Green and White LED sub-modules are connected in series with each LED driver. The dashed lines on the schematic indicate digital lines while the solid lines indicate analogue electrical lines.

The LED module of the present invention provides benefits during manufacture, as it eliminates the necessity for wavelength binning of LEDs and phosphors prior, as well as post incorporation into the LED module. This dramatically reduces the cost of sorting LED die prior to LED module packaging as well as eliminates the necessity to match LED die to the correct phosphor composition with a matched absorption spectrum.

Additionally, introducing individual LED and WCE elements having different wavelength emission spectra enables the modification or trimming of individual spectra regions in order to select a pre-determined colour chromaticity on the CIE diagram. The passive trimming may be achieved by electrically activating individual LEDs at different powers and pre-setting the power ratios between individual LED and WCE elements. This enables a single LED module having multiple LED and WCE elements to achieve any predefined colour chromaticity within a specific triangle on the CIE diagram without the need for manufacture of many LED modules and having only a finite manufacture yield of achieving the desired colour chromaticity bin.

The elimination of manufacture binning also enables reduced LED module costs as the exact number of LED modules may be manufactured and factory preset rather than a much larger volume that is binned due to manufacture variability.

The LED module of the present invention also provides benefits for the end user, whereby introducing a control module enables the LED module to modify and shift colour chromaticity at the users input. Additionally, the ability to preset the LED modules during manufacture enables dramatically reduced manufacture leadtime for custom colour LED modules. Finally, the ability to control and monitor the LED module colour characteristics guarantees that the LED module maintains identical colour chromaticity over the complete lifetime of the LED module.

Figure 7:
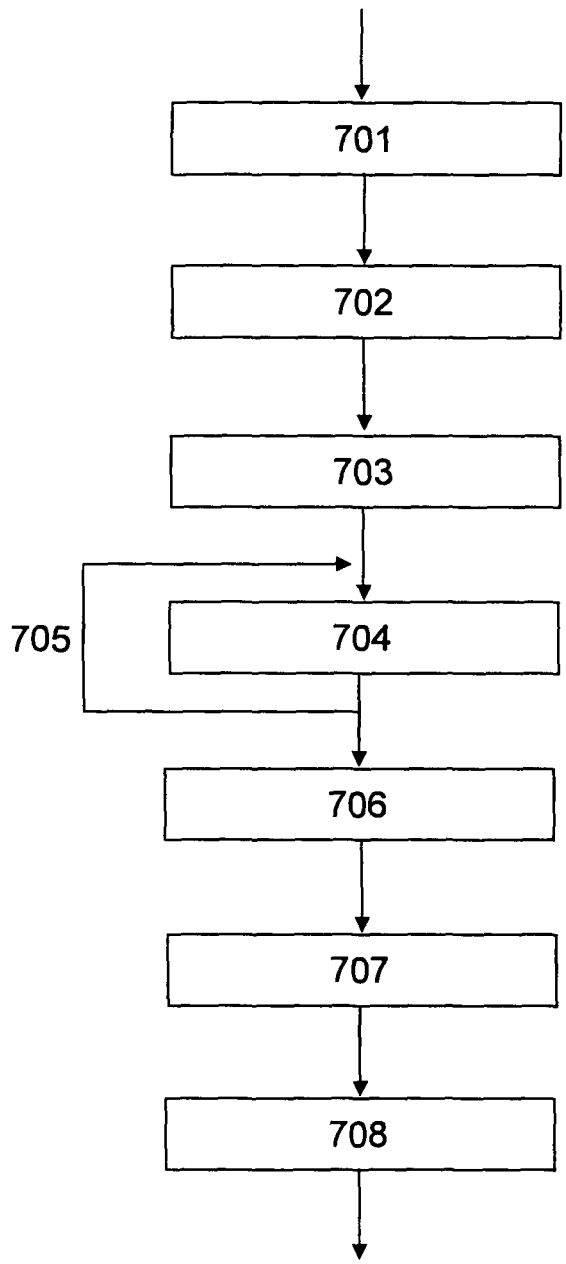

In a third aspect of the present invention a method of manufacture of the present LED module and control system is proposed, as depicted in the schematic diagram of FIG. 7.

The LED die are attached, 701, on a sub-mount having an electrical isolation layer and a tracking layer. The ohmic contacts of the LED are subsequently wire bonded, 702, to the appropriate electrical tracking lines. The metal reflector cups are subsequently aligned to the LED die and attached to the submount, 703. An encapsulant is dispensed into the reflector cups, 704, and designed to protect the LED die and wire bonds from the environment while also improving light extraction.

The WCE elements are pre-mixed to the right percentage weight into an encapsulant. The encapsulant may be organic, inorganic or hybrid material. The correct WCE element is depositing in the pre-designated LED sub-module, 704. It is designed that the WCE is at least residing on the top surface of the LED die and in contact with part of the reflector cup edge. The deposition of WCE elements in each of the multiple reflector cups is repeated, 705, until all of the individual LED sub-modules have been completed.

The WCE may be deposited using a technique such as, but not limited to, dispensing, dip coating, screen printing, ink jetting, spraying, plasma deposition and sputtering.

The control system and interface electrical tracking is subsequently assembled 706. The LED module is activated and the light output is monitored to generate the presetting calibration parameters, 707. The preset parameters are downloaded into the control unit via the interface, 708.

The invention claimed is:

1. An LED module system comprising an LED module, a light sensor, and a control system, the LED module comprising a first and a second LED sub-module disposed on a thermally-conducting sub-mount, wherein:
the first LED sub-module includes:
a first semiconductor LED for generating light when activated, the first LED being in thermal contact with the sub-mount;
a first thermally-conducting reflector cup, the first LED being disposed in the first reflector cup; and,
a first wavelength converting element (WCE) at least partially in contact with the first reflector CUP and at least partially disposed over a surface of the first LED such that the light emitted from the first LED is incident on the first WCE and is re-emitted at a substantially different wavelength; and,
the second LED sub-module includes:
a second semiconductor LED for generating light when activated, the second LED being in thermal contact with the sub-mount and constructed in the same semiconductor material system as the first LED;
a second thermally-conducting reflector cup, the second LED being disposed in the second reflector cup; and,
a second wavelength converting element (WCE) at least partially in contact with the second reflector CUP and at least partially disposed over a surface of the second LED such that the light emitted from the second LED is incident on the second WCE and is re-emitted at a substantially different wavelength, the second WCE having different wavelength converting properties to the first WCE,
wherein the total light emitted by the LED module comprises the light generated from the first LED and first WCE and the light generated from the second LED and second WCE, the LED module being configured to emit the total light having a predefined colour chromaticity when one or more activation properties of the first and second LED are managed,
wherein the light sensor is orientated to measure the colour chromaticity properties of at least part of the total light emitted by the LED module, and
wherein the control system is configured for managing activation properties of the first and second LEDs in the LED module when activated, the control system being coupled to the light sensor and adapted to provide feedback to modify the activation properties of the first and second LEDs to achieve the predefined colour chromaticity for the total light emitted by the LED module and also a colour rendering index (CRI) greater than a predefined minimum CRI.

2. An LED module system according to claim 1, wherein at least one of the first and the second WCE is selected from a group of WCE elements which comprises phosphors, quantum dots (QDs), organic light emitting material, and electrically, ionically- or optically-pumped light emitting materials.

3. An LED module system according to claim 1, wherein the sub-mount comprises an electrical board having electrical tracking and an electrical isolation layer disposed between the tracking and a substrate.

4. An LED module system according to claim 1, wherein the sub-mount comprise a substrate formed from a material selected from the group of high thermal conductivity materials which includes Cu, Al, W, Ag, CVD diamond, Diamond-Like Carbon (DLC), and ceramics.

5. An LED module system according to claim 1, wherein at least one of the sub-mount and the first reflector cup and the second reflector cup comprises a material having a thermal conductivity greater than 50 W/mK.

6. An LED module system according to claim 1, wherein the second WCE is adapted to re-emit light with a red shifted wavelength emission spectrum relative to the first WCE and with an emission bandwidth greater than 40 nm.

7. An LED module system according to claim 1, wherein upon activation:
each of the first and the second semiconductor LED emit light in the blue wavelength range;
the first WCE is configured to re-emit substantially in the yellow wavelength range; and,
the second WCE is configured to re-emit substantially in the red wavelength range.

8. An LED module system according to claim 1, wherein the first reflector CUP and the second reflector cup are configured to mix the light generated from the first LED sub-module and the second LED sub-module in the far field and such that the total light emitted from the LED module is more collimated than from a Lambertian source in the far field.

9. An LED module system according to claim 1, the LED module further comprising a third LED sub-module disposed on the thermally-conducting sub-mount, the third LED sub-module comprising:
a third semiconductor LED for generating light when activated, the third LED being in thermal contact with the sub-mount and constructed in the same semiconductor material system as the first and the second semiconductor LEDs,
a third thermally-conducting reflector cup, the third LED being disposed in the third reflector cup; and,
a third wavelength converting element (WCE) at least partially disposed on a surface of the third LED,
wherein upon activation:
each of the first, the second and the third semiconductor LEDs emit light in the blue wavelength range;
the first WCE is configured to re-emit substantially in the yellow wavelength range;
the second WCE is configured to re-emit substantially in the red wavelength range; and,
the third WCE is configured to re-emit substantially in the green wavelength range,
wherein the total light emitted by the LED module further comprises the light generated from the third LED and WCE and the LED module is configured to emit total light having the predefined colour chromaticity when one or more activation properties of the third LED are also managed.

10. An LED module system according to claim 9, wherein one or more of the first and the second LEDs comprises an array of multiple LED die.

11. An LED module system according to claim 1, wherein the control system is further adapted to monitor electrical and thermal properties of the semiconductor LEDs in the module and to provide feedback to modify activation properties of the semiconductor LEDs in order to achieve the predefined colour chromaticity for the total light emitted by the LED module.

12. An LED module system according to claim 1, the system further comprising an interface for connecting the control system to external sources and for receiving information from the external sources.

13. An LED module system according to claim 1, wherein the predefined colour chromaticity is such that the total light emitted from the LED module resides along the Planckian locus on a colour chromaticity diagram and within a chromaticity rectangle bounded by the CIE (x,y) coordinates (0.300, 0.300) and (0.525, 0.450).

14. A method of manufacturing the LED module system according to claim 1, the method comprising the steps of:
   die attaching the first LED and the second LED on the sub-mount;
   affixing the first reflector cup around the first LED;
   affixing the second reflector cup around the second LED;
   depositing the first WCE element on at least part of the surface of the first LED and at least partially in contact with the first reflector cup; and,
   depositing the second WCE element on at least part of the surface of the second LED and at least partially in contact with the second reflector cup,
   assembling the control system and interfacing it to the first and second LEDs;
   providing the light sensor coupled to the control system and oriented to measure the colour chromaticity properties of at least part of the total light emitted by the LED module; and,
   presetting parameters in the control system, whereby the control system is adapted to manage the activation properties of the first and second semiconductor LEDs in the LED module to achieve the predefined colour chromaticity for the total light emitted by the LED module and also the CRI greater than the predefined minimum CRI.

15. A method of manufacturing the LED module system according to claim 14, wherein the predefined minimum CRI is 85.

16. An LED module system according to claim 15, the module further comprising a fourth LED sub-module disposed on the thermally-conducting sub-mount, the fourth LED sub-module comprising:
   a fourth semiconductor LED for generating light when activated, the fourth LED being in thermal contact with the sub-mount and constructed in the same semiconductor material system as the first, the second and the third semiconductor LED; and,
   a thermally-conducting reflector cup, the fourth LED being disposed in the fourth reflector cup,
   wherein, upon activation, the first, the second, and the third LEDs emit light in the blue wavelength range, and the fourth semiconductor LED emits light in the near UV or red-shifted blue wavelength range substantially different to the blue wavelength emitted by the first, the second, and the third semiconductor LED, and
   wherein the total light emitted by the LED module further comprises the light generated from the fourth LED and the LED module is configured to emit total light having the predefined colour chromaticity when one or more activation properties of the fourth LED are also managed.

17. An LED module system according to claim 1, wherein the predefined minimum CRI is 85.

* * * * *

UNITED STATES PATENT AND TRADEMARK OFFICE
CERTIFICATE OF CORRECTION

PATENT NO.        : 8,556,438 B2
APPLICATION NO.   : 13/056806
DATED             : October 15, 2013
INVENTOR(S)       : McKenzie et al.

It is certified that error appears in the above-identified patent and that said Letters Patent is hereby corrected as shown below:

On the Title Page, Item (73), replace Assignee "Synoptics Limited, Cambridge (GB)" with --PhotonStar LED Limited, Hants (GB)--.

Signed and Sealed this
Eighth Day of April, 2014

Michelle K. Lee
*Deputy Director of the United States Patent and Trademark Office*